(12) United States Patent
Wittmann et al.

(10) Patent No.: US 12,249,597 B2
(45) Date of Patent: Mar. 11, 2025

(54) DISPLAY DEVICE AND DISPLAY UNIT

(71) Applicant: OSRAM Opto Semiconductors GmbH, Regensburg (DE)

(72) Inventors: Sebastian Wittmann, Regenstauf (DE); Thomas Schwarz, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 394 days.

(21) Appl. No.: 17/638,681

(22) PCT Filed: Oct. 5, 2020

(86) PCT No.: PCT/EP2020/077853
§ 371 (c)(1),
(2) Date: Feb. 25, 2022

(87) PCT Pub. No.: WO2021/069378
PCT Pub. Date: Apr. 15, 2021

(65) Prior Publication Data
US 2022/0293577 A1    Sep. 15, 2022

(30) Foreign Application Priority Data
Oct. 7, 2019   (DE) .................... 10 2019 126 859.1

(51) Int. Cl.
*H01L 25/16*     (2023.01)
*H01L 23/538*    (2006.01)
(Continued)

(52) U.S. Cl.
CPC ........ *H01L 25/167* (2013.01); *H01L 23/5381* (2013.01); *H01L 23/5386* (2013.01);
(Continued)

(58) Field of Classification Search
CPC ... H01L 23/538; H01L 23/5386; H01L 24/20; H01L 24/24; H01L 25/167;
(Continued)

(56) References Cited

U.S. PATENT DOCUMENTS

2006/0208624 A1   9/2006   Yoshimoto
2008/0278410 A1   11/2008  Yamashita et al.
(Continued)

FOREIGN PATENT DOCUMENTS

EP   3 096 370 A1    11/2016
JP   2006-295121 A   10/2006
(Continued)

OTHER PUBLICATIONS

International Search Report issued for corresponding International Patent Application No. PCT/EP2020/077853 on Feb. 1, 2021, along with an English translation.
(Continued)

*Primary Examiner* — Victor A Mandala
*Assistant Examiner* — Lawrence C Tynes, Jr.
(74) *Attorney, Agent, or Firm* — HAUPTMAN HAM, LLP

(57) ABSTRACT

A display device with a connection carrier and a plurality of pixels, which are drivable via row lines and column lines, is specified. The row lines and the column lines are arranged on the connection carrier. At least one row line is interrupted at an imaginary crossing point with a column line on the connection carrier. A bridging component is arranged on the connection carrier, which bridges the row line at the imaginary crossing point in an electrically conductive manner.

18 Claims, 19 Drawing Sheets

(51) Int. Cl.
*H01L 25/065* (2023.01)
*H01L 25/075* (2006.01)
*H01L 33/62* (2010.01)
*G09G 3/32* (2016.01)
*H01L 23/00* (2006.01)

(52) U.S. Cl.
CPC ...... *H01L 25/0655* (2013.01); *H01L 25/0753* (2013.01); *H01L 33/62* (2013.01); *G09G 3/32* (2013.01); *G09G 2300/0426* (2013.01); *G09G 2300/0452* (2013.01); *G09G 2300/06* (2013.01); *H01L 24/05* (2013.01); *H01L 24/08* (2013.01); *H01L 24/16* (2013.01); *H01L 24/20* (2013.01); *H01L 24/24* (2013.01); *H01L 24/32* (2013.01); *H01L 2224/05644* (2013.01); *H01L 2224/08225* (2013.01); *H01L 2224/16225* (2013.01); *H01L 2224/2105* (2013.01); *H01L 2224/221* (2013.01); *H01L 2224/24226* (2013.01); *H01L 2224/32225* (2013.01)

(58) Field of Classification Search
CPC ...... H01L 2224/24226; G09G 2300/06; G09G 2300/0426; G09G 2300/0452; G09G 2300/0413; G09G 3/32; G09G 2330/08
See application file for complete search history.

(56) References Cited

U.S. PATENT DOCUMENTS

| | | |
|---|---|---|
| 2010/0207852 A1 | 8/2010 | Cok |
| 2010/0328196 A1 | 12/2010 | Cok |
| 2012/0126233 A1 | 5/2012 | Chang et al. |
| 2017/0256522 A1 | 9/2017 | Cok et al. |
| 2018/0033853 A1 | 2/2018 | Bower et al. |
| 2018/0254226 A1* | 9/2018 | Iguchi .................. H01L 27/156 |
| 2019/0027534 A1 | 1/2019 | Rotzoll et al. |
| 2019/0267363 A1 | 8/2019 | Bower et al. |
| 2022/0013699 A1 | 1/2022 | Wittmann et al. |

FOREIGN PATENT DOCUMENTS

| | | |
|---|---|---|
| JP | 2011-76808 A | 4/2011 |
| JP | 2012-518199 A | 8/2012 |
| JP | 2012-531627 A | 12/2012 |
| JP | 2013-546012 A | 12/2013 |
| JP | 2017-175093 A | 9/2017 |
| WO | 2011/040081 A1 | 4/2011 |

OTHER PUBLICATIONS

Written Opinion issued for corresponding International Patent Application No. PCT/EP2020/077853 on Feb. 1, 2021.

* cited by examiner

DISPLAY DEVICE AND DISPLAY UNIT

CROSS REFERENCE TO RELATED APPLICATION

This application is a National Stage of International Application No. PCT/EP2020/077853, filed on Oct. 5, 2020, which designates the United States and was published in Europe, and which claims priority to German Patent Application No. 10 2019 126 859.1, filed on Oct. 7, 2019, in the German Patent Office. Both of the aforementioned applications are hereby incorporated by reference in their entireties.

The present application relates to a display device and a display unit with such a display device.

For a display with a plurality of pixels, for example, light-emitting diodes can be arranged in a matrix arrangement and electrically contacted via row lines and column lines. For example, the row lines and column lines are formed in two metal layers of a printed circuit board that are electrically insulated from each other, so that no short circuit occurs between these lines.

It is an object to specify a display device which is characterized by a simplified structure and can be manufactured at low cost.

This object is solved inter alia by a display device with the features of claim 1. Further embodiments and expediencies are the subject of the dependent claims.

A display device with a plurality of pixels is specified. The term display device generally refers to a radiation-emitting device in which individual radiation-emitting elements are drivable independently of one another.

Expediently, the pixels are arranged in matrix form in rows and columns. For example, the pixels are electrically controllable via an active-matrix circuit or a passive-matrix circuit.

For example, the display device is monochrome. That is, the radiation emitted by the individual radiation emitting elements is the same with respect to its spectral characteristics across the radiation emitting elements except for manufacturing tolerances. For example, all pixels emit radiation that appears white to the human eye. Such a display device is suitable, for example, as a light source in a pixelated headlight, in a pixelated flash light, or for displaying visual information.

Alternatively, the display device is multicolored. For example, each pixel comprises a triplet of sub-pixels emitting radiation in, for example, the red, green and blue spectral ranges. Visual information, for example static or moving images, can thus be displayed in full color.

According to at least one embodiment of the display device, the display device comprises a connection carrier. The connection carrier has the pixels arranged thereon. The connection carrier may be rigid or flexible.

According to at least one embodiment of the display device, the pixels are drivable via row lines and column lines. The designations row lines and column lines are used merely for simplified reference to lines extending obliquely or perpendicularly to one another and are interchangeable. In particular, at least one row line and at least one column line are associated with each pixel. For example, the display device comprises at least ten row lines and/or at least 10 column lines.

For example, all pixels of a row are electrically connected with a common row line. The number of row lines may be greater than or equal to the number of rows. Accordingly, all pixels of a column are electrically connected with a common column line. The number of column lines may be greater than or equal to the number of columns.

According to at least one embodiment of the display device, the row lines and the column lines are formed on the connection carrier. In a top view of the display device, in particular all pixels overlap with the connection carrier.

Expediently, the row lines run parallel to each other at least in places. Correspondingly, the column lines run parallel to each other at least in places. At least one row line runs obliquely or perpendicularly to at least one column line or also to all column lines.

According to at least one embodiment of the display device, at least one row line is interrupted at an imaginary crossing point with a column line on the connection carrier. An imaginary crossing point refers to a location where a row line and a column line would cross if the row line were not interrupted in the region of the column line and extended uniformly across the column line. In particular, one row line or are several or even all row lines interrupted at all points where they would cross a column line. For ease of reference, the line interrupted on the connection carrier is referred to as the row line and the line extending obliquely or perpendicularly thereto is referred to as the column line, unless explicitly specified otherwise. In particular, this does not imply any restriction to the effect that the row line runs horizontally in space and the column line runs vertically in space. It is merely decisive that at least one of two lines is interrupted at imaginary crossing points on the connection carrier.

According to at least one embodiment of the display device, a bridging component is arranged on the connection carrier, which bridges the row line at the imaginary crossing point in an electrically conductive manner.

With other words, a row line is divided into two sub-regions separated from each other, which are located on different sides of a column line. The two sub-regions are electrically conductively connected to each other via the bridging component. Thus, by means of the bridging component, a continuous electrical connection of the sub-regions of a row line is achieved, although the row lines per se are interrupted at the imaginary crossing points with the column lines. In particular, all pixels associated with a row line can be electrically contacted with a common terminal of this row line.

For example, the bridging component overlaps with at least one column line or at least one further row line when viewed from above onto the display device.

In particular, the bridging component is attached to the connection carrier as a prefabricated component, for example via a connecting agent such as an adhesive or a solder.

The row lines and column lines comprise, for example, terminals for electrical contacting, for example with a driver for driving the pixels.

In at least one embodiment of the display device, the display device comprises a connection carrier and a plurality of pixels drivable via row lines and column lines. The row lines and the column lines are formed on the connection carrier, and at least one row line is interrupted at an imaginary crossing point with a column line on the connection carrier. A bridging component is arranged on the connection carrier, which bridges the row line at the imaginary crossing point in an electrically conductive manner.

For example, the row lines and the column lines comprise terminals for electrical contact with a driver for driving the pixels, wherein row lines are each connected to one of the terminals via a feed line, and wherein row lines which are located between a row line and the associated terminal are bridged by means of a bridging component.

A crossing-free path between the row line and the column line is thus not achieved by means of an electrical insulation in the form of an electrically insulating layer between two electrically conductive layers. Such an electrically insulating layer between the row lines and the column lines can be dispensed with. This simplifies the structure of the connection carrier with the row lines and the column lines. Furthermore, the number of layers on the connection carrier is reduced. In this context, both a partial layer of the connection carrier and a layer applied to the connection carrier are referred to as a layer on the connection carrier.

The electrically continuous contacting with row lines and column lines can be achieved via the bridging component arranged on the connection carrier without the row lines and column lines crossing each other. This bridging component can be prefabricated separately from the connection carrier and attached to the display device during producing.

Further, one or more of the bridging components can be used to provide overlap-free routing of the feed lines to the terminals. Thus, the connection with a driver can be integrated into the layer used for the electrically conductive layer for the row lines and the column lines.

According to at least one embodiment of the display device, the row lines and the column lines are formed without overlapping each other in a top view of the connection carrier. In particular, the row lines and column lines do not overlap at any point. In producing the display device, the row lines and the column lines may be formed on the connection carrier by means of a single electrically conductive layer, such as in the form of an electrically conductive layer of the connection carrier or an electrically conductive coating on the connection carrier.

According to at least one embodiment of the display device, the bridging component comprises two contacts which are at the same potential during operation of the display device and are electrically conductively connected with the same row line. In particular, one of the contacts is electrically conductively connected with one of the sub-regions of a row line in each case, wherein the sub-regions of the row line would not be electrically conductively connected with each other without the bridging component.

No voltage drop, or at least no significant voltage drop, occurs between the two contacts of the bridging component. For example, a bridging path is formed between the two contacts in the bridging component. In particular, the bridging path is formed by an electrical line with a negligible ohmic resistance.

In the simplest case, the bridging component comprises exactly two contacts. In this case, the bridging component merely fulfills the function of an electrically conductive connection between the two contacts.

According to at least one embodiment of the display device, the bridging component comprises at least one active region provided for generating radiation. For example, the radiation is in the visible, ultraviolet or infrared spectral range. For example, the active region is part of a light emitting diode. For example, the active region forms a pixel or a sub-pixel of the display device. Expediently, the active region is electrically conductively connected with the contacts and a further contact of the bridging component. In particular, the further contact is electrically conductively connected with a column line of the display device. In particular, the bridging path of the bridging component does not extend through the active region of the bridging component. For example, all pixels of the display device are formed by bridging components, wherein a bridging component forms one or more pixels.

According to at least one embodiment of the display device, the bridging component comprises a plurality of active regions, each forming one of the pixels or a sub-pixel of the pixels. The more pixels a bridging component forms, the fewer bridging components are required for the same total number of pixels.

According to at least one embodiment of the display device, the bridging component comprises at least one electronic component. For example, the electronic component is a transistor or a capacitor. In particular, the electronic component is configured for driving at least one active region of the bridging component, for example for driving by means of an active matrix circuit.

According to at least one embodiment of the display device, the bridging component comprises a submount on which at least one pixel is formed. For example, the submount comprises the contacts on a side facing the associated row line.

According to at least one embodiment of the display device, the submount comprises a plurality of vias, wherein the at least one pixel is formed on a side of the submount facing away from the connection carrier. For example, the bridging path between the contacts is also formed on the side of the submount facing away from the connection carrier. For example, two vias serve for an electrically conductive connection to the contacts. Furthermore, one via or a plurality of vias can be configured for an electrical connection with a further contact or a plurality of further contacts.

According to at least one embodiment of the display device, in a sectional view of the display device, the bridging component and/or at least one pixel are arranged between the connection carrier and one of the row lines. For example, the row lines and the column lines electrically contact the pixels by means of planar contacting. For this purpose, an electrically conductive coating is applied to the connection carrier to form the row lines and the column lines after the bridging components are already attached to the connection carrier. In a top view of the display device, at least one row line overlaps with the bridging component. In particular, two sub-regions of one and the same row line overlap with the bridging component.

According to at least one embodiment of the display device, the bridging component and/or at least one pixel are arranged on a side of one of the row lines facing away from the connection carrier. In this case, the row lines and the column lines are expediently already present on the connection carrier before the bridging component is attached to the connection carrier and electrically conductively contacted.

According to at least one embodiment of the display device, the connection carrier is transmissive to radiation emitted by the pixels during operation. For example, the connection carrier includes a glass or a transmissive plastic, such as in the form of a polymer film.

For example, the connection carrier, in particular a side of the connection carrier facing away from the pixels, forms a radiation exit surface of the display device.

According to at least one embodiment of the display device, more column lines than row lines are associated with a pixel, or vice versa. For example, the pixels are arranged in an active matrix circuit and each of the pixels is assigned exactly one row line and several column lines, for example three column lines.

By an arrangement with exactly one row line or exactly one column line, the number of imaginary crossing points is minimized. As a result, the number of bridging components required can also be reduced while the total number of pixels remains the same and the number of pixels per bridging component remains the same.

According to at least one embodiment of the display device, the display device is free of terminals for the electrical contacting of the row lines and the column lines on at least three side surfaces, for example on exactly three side surfaces or also on all side surfaces. Along side surfaces that are free of feed lines, display devices can be lined up in a simplified manner to achieve a large display unit.

According to at least one embodiment of the display device, terminals for the electrical contacting of the row lines and the column lines are arranged along exactly one side surface of the display device. That means, all terminals for the row lines and for the column lines are accessible from one side of the display device. This simplifies the electrical contacting of the row lines and column lines. For example, the display device is free of terminals for the electrical contacting of the row lines and the column lines on three side surfaces.

According to at least one embodiment of the display device, the row lines are each connected to one of the terminals via a feed line, and the feed lines extend without overlap to the row lines. For example, row lines which are located between a row line and the associated terminal are bridged by means of a bridging component. It is expedient that the feed lines run without overlap to the row lines and to the column lines. The feed lines, the column lines and the row lines can thus be formed in a single, common electrically conductive layer on the connection carrier.

According to at least one embodiment of the display device, a driver for driving the row lines and the column lines is arranged on a side facing away from a radiation exit surface of the display device, and all side surfaces of the display device are free of terminals for the row lines and the column lines. Such display devices can be arranged side by side along two mutually perpendicular directions in a simplified manner, so that the size of a display unit is not limited in principle with respect to the number of pixels by using a plurality of such display devices.

According to at least one embodiment of the display device, the row lines are each connected to the driver via a feed line, and the feed lines run without overlap to the row lines and/or to the column lines. Thus, the connection with the driver can be integrated into the electrically conductive layer for the row lines and the column lines.

According to at least one embodiment of the display device, the feed lines are connected to the driver via a connector, wherein the connector comprises a larger extension in a direction parallel to the row lines than the driver and wherein the connector extends at least over all inner column lines in a top view of the display device. In this context, column lines which are not located at the edge of the display device are referred to as inner column lines. With other words, the first column line and the last column line of a display device, respectively, are not inner column lines. By means of the connector, the column lines can be contacted in a simplified manner, even if the lateral extent of the driver perpendicular to the column lines is less than the lateral extent of the display device. For example, the connector is integrated into a housing of the driver.

Further, a display unit is specified with a plurality of display devices. The display devices may each comprise one or more features of the foregoing embodiments.

By combining a plurality of display devices, the total number of pixels along one direction or along two mutually perpendicular directions can be increased, in particular without recognizably increased distances between the nearest rows or columns of two adjacent display devices.

The present application is based in particular on the idea that the display device can be manufactured more economically overall if only one electrically conductive layer, for example a layer of metal, is used for the formation of the row lines and column lines. In the bridging components, the crossover-free routing of the electrical contacting can be carried out more cost-effectively due to the much denser packing, even if the complexity of a bridging component is intrinsically greater than that of a conventional component located at crossover points of mutually insulated row lines and column lines.

In addition, absorption losses in the display device can be reduced by reducing the number of layers required.

Thus, the problem of routing orthogonally running conductor paths without intersections is not handled at the level of the connection carrier, which comprises the extent of the display device. Instead, the bridging is done at the level of components, the bridging components, which are manufactured separately from the connection carrier.

The display device is particularly suitable as a pixelated light source for displays, especially transparent displays or video walls. In general, the display device is suitable for all devices in which pixelated radiation is desired and control is in matrix form, for example as an active matrix or as a passive matrix.

Further embodiments and expediencies will be apparent from the following description of the exemplary embodiments in conjunction with the figures.

In the Figures:

FIGS. 1A and 1B show an exemplary embodiment for a display device in schematic top view (FIG. 1A) and by means of a detail of the display device in schematic sectional view (FIG. 1B);

FIGS. 2A, 2B, 2C, 2D, 2E, and 2F each show an exemplary embodiment of a display device by means of a detail in schematic sectional view;

FIGS. 3A, 3B, 3C, 3D, 3E, and 3F each show an exemplary embodiment of a display device by means of a detail in schematic sectional view;

FIGS. 4A and 4B each show an exemplary embodiment for a display device in schematic top view;

FIGS. 5A and 5B each show an exemplary embodiment of a bridging component and associated contacting in a display device in top view (FIG. 5A) and on the rear side of the bridging component (FIG. 5B);

FIGS. 5C and 5D each show an exemplary embodiment of a bridging component in schematic sectional view;

FIGS. 9A and 9B show an exemplary embodiment of a display device in schematic top view, wherein FIG. 9B shows a detail 97 of FIG. 9A enlarged;

FIGS. 9C and 9D show an exemplary embodiment for a display device in schematic top view, wherein FIG. 9D shows a detail 98 of FIG. 9C enlarged;

Elements that are identical, similar or have the same effect are marked with the same reference signs in the figures.

The figures are each schematic representations and therefore not necessarily to scale. Rather, comparatively small elements and, in particular, layer thicknesses may be shown exaggeratedly large for the sake of clarity.

Figure 1A:
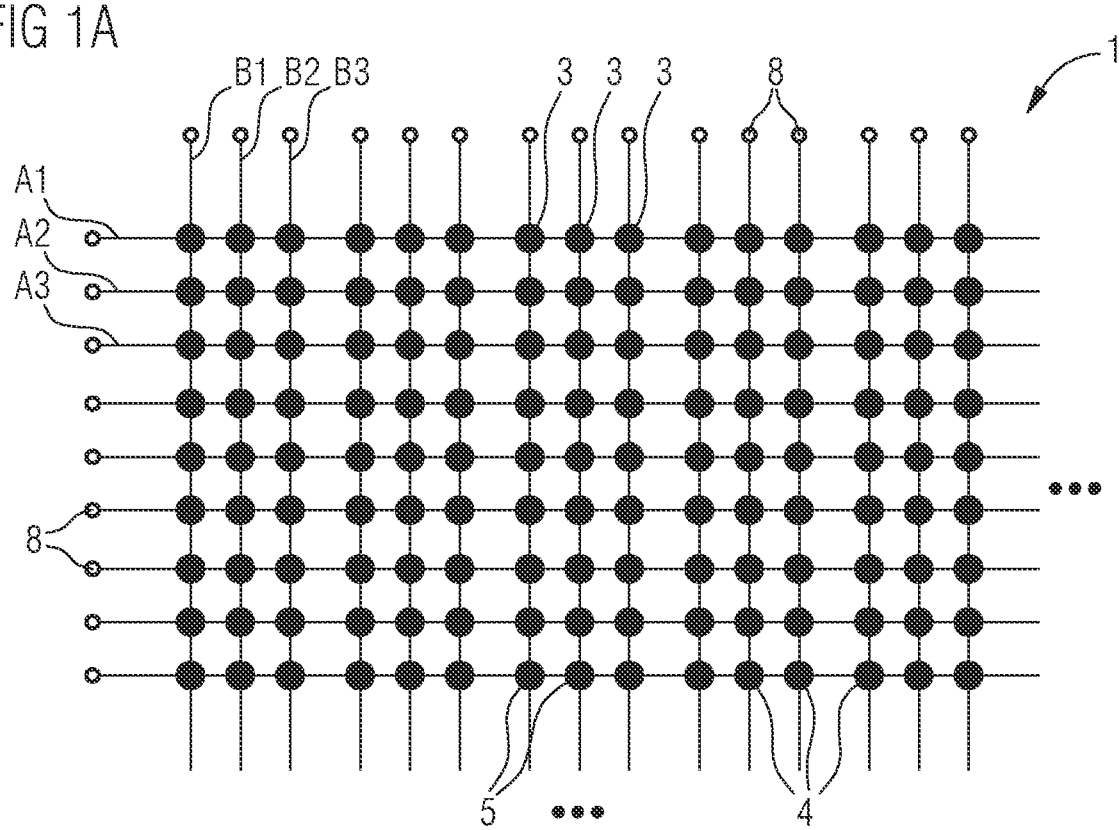
Figure 1B:
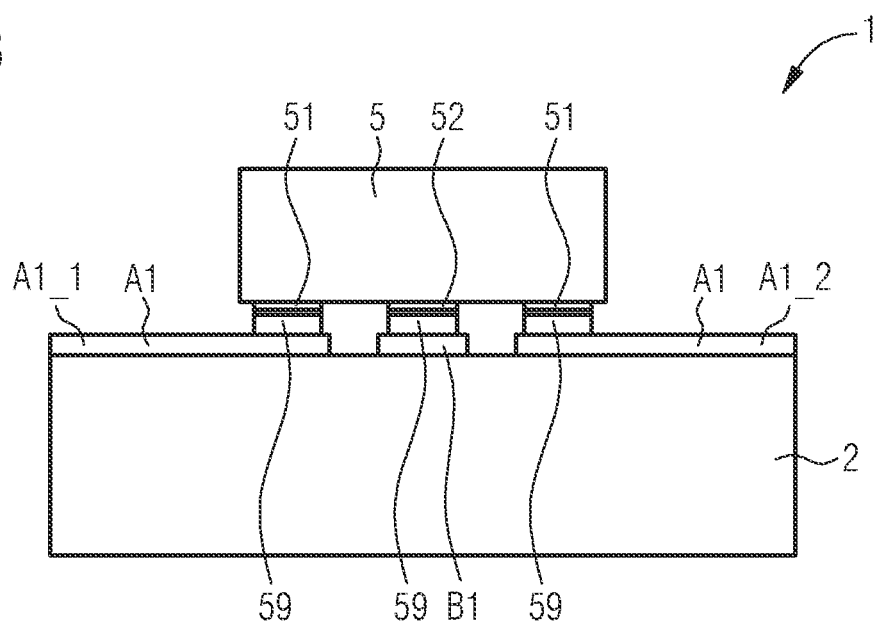

The display device 1 shown in FIGS. 1A and 1B comprises a plurality of row lines A1, A2, . . . . Column lines B1, B2, . . . extend perpendicular to the row lines A1, A2, . . . . The row lines A1, A2, . . . and column lines B1, B2, . . . can each be electrically contacted from the edge of the display device via terminals 8. At the points where the row lines A1, A2, . . . and the column lines B1, B2, . . . would cross if both the row lines A1, A2, . . . and the column lines were continuous, the row lines A1, A2, . . . are interrupted.

FIG. 1B shows a sectional view at which the row line A1 comprises a first sub-region A1_1 and a second sub-region A1_2. These sub-regions are located on opposite sides of a column line, exemplarily column line B1. The sub-regions A1_1 and A1_2 of the row line A1 are electrically bridged by means of a bridging component 5 of the display device 1 and are thus electrically conductively connected to one another via the bridging component 5.

For this purpose, the bridging component 5 comprises contacts 51, wherein each of the contacts overlaps with and is electrically conductively connected with one of the sub-regions of the row line A1. The bridging component 5 is electrically conductively and mechanically stably connected to the row line A1 of the connection carrier 2 via the contacts 51, exemplarily by means of a connecting agent 59, such as a solder or an electrically conductive adhesive.

Details of the bridging component 5 are not shown in FIG. 1B for simplified illustration. For example, the bridging component is designed as shown in FIG. 2B. The bridging component 5 comprises a bridging path 55 via which the contacts 51 are electrically conductive with each other, wherein the contacts 51 are at the same electrical potential during operation of the display device. Further, the bridging component 5 comprises an active region 6 provided for generating radiation, such as in the form of a light emitting diode. Thus, the bridging path 55 connects the contacts 51 to each other without passing through the active region 6.

The bridging paths 55 are not explicitly shown in part in the following exemplary embodiments for simplified illustration.

In the exemplary embodiment illustrated in FIG. 1A, one such bridging component 5 is located at each imaginary crossing point 4 of row lines A1, A2, . . . and column lines B1, B2, . . . . Each active region 6 of a bridging component 5 here forms a pixel 3 of the display device. With n rows and m columns, the display device thus comprises n*m bridging components 5 and n*m monochrome pixels 3. The pixels 3 are driven, for example, by a passive matrix drive, so that each individual pixel can be driven independently of the other pixels 3 by applying an electrical voltage between the associated column line and the associated row line.

All pixels 3 located in a row line can thus be contacted via the associated row line, although the row lines per se are interrupted on the connection carrier 2 in the region of the column lines B1, B2, . . . in each case. The bridging components 5 are arranged in each case at the imaginary crossing points 4 between the row lines A1, A2, . . . and the column lines B1, B2, . . . . In particular, the bridging components 5 each overlap with a row line and a column line and are electrically conductively connected with this row line and column line, respectively.

Further bridging components 5 may find application for feed lines to the terminals 8. This is described in more detail in connection with subsequent exemplary embodiments.

However, deviating from the described exemplary embodiment, the number of bridging components can also be smaller than the number of imaginary crossing points 4 and/or smaller than the number of pixels 3. Also the number of row lines A1, A2, . . . and/or the number of column lines B1, B2, . . . does not have to correspond to the number of rows or columns, respectively, in which the pixels 3 are arranged.

Figure 2A:
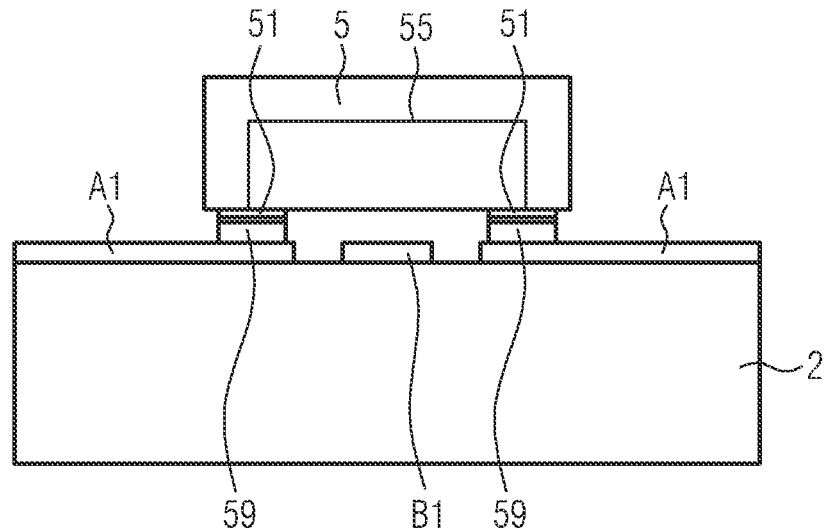
Figure 2B:
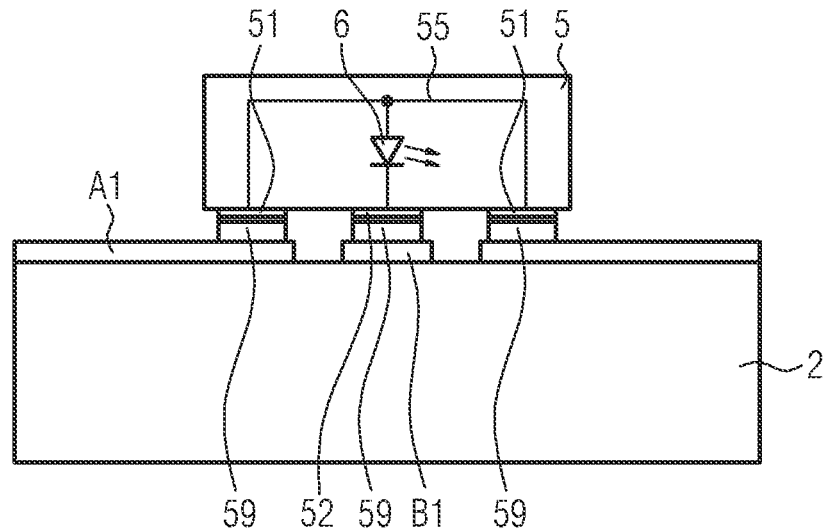

FIG. 2A shows an exemplary embodiment of a bridging component 5 which serves exclusively to bridge a line, exemplary the column line B1. The bridging component 5 comprises only a bridging path 55 between the contacts 51. Thus, apart from electrically connecting sub-regions of a row line, preferably with negligible electrical resistance, the bridging component 5 does not perform any other function.

In the exemplary embodiment illustrated in FIG. 2B, the bridging component 5 comprises, in addition to the bridging path 55, an active region 6 intended for generating radiation. The active region 6 is electrically conductively connected with the contacts 51 and a further contact 52. The further contact 52 is electrically conductively connected with its associated column line, for example the column line B1. The bridging path 55 therefore does not run through the active region 6.

Figure 2C:
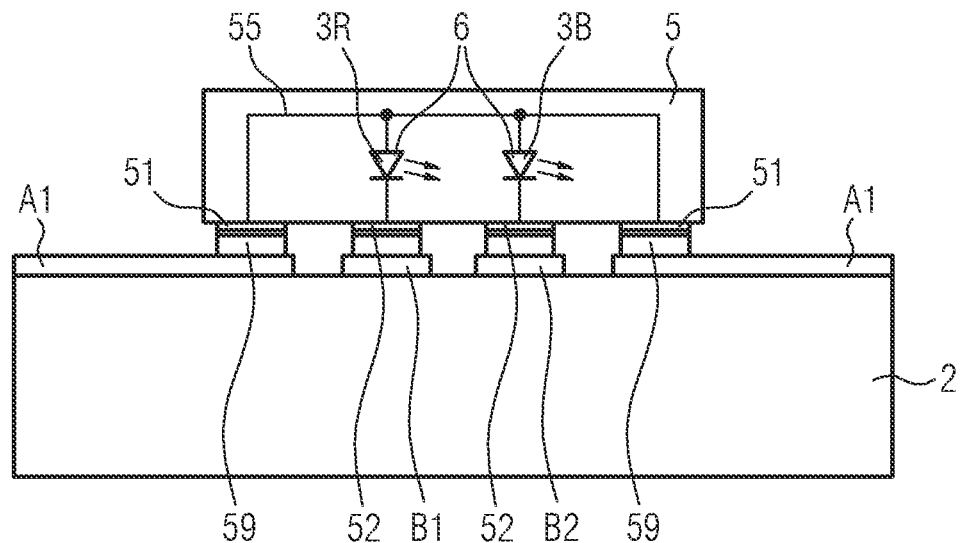
Figure 2D:
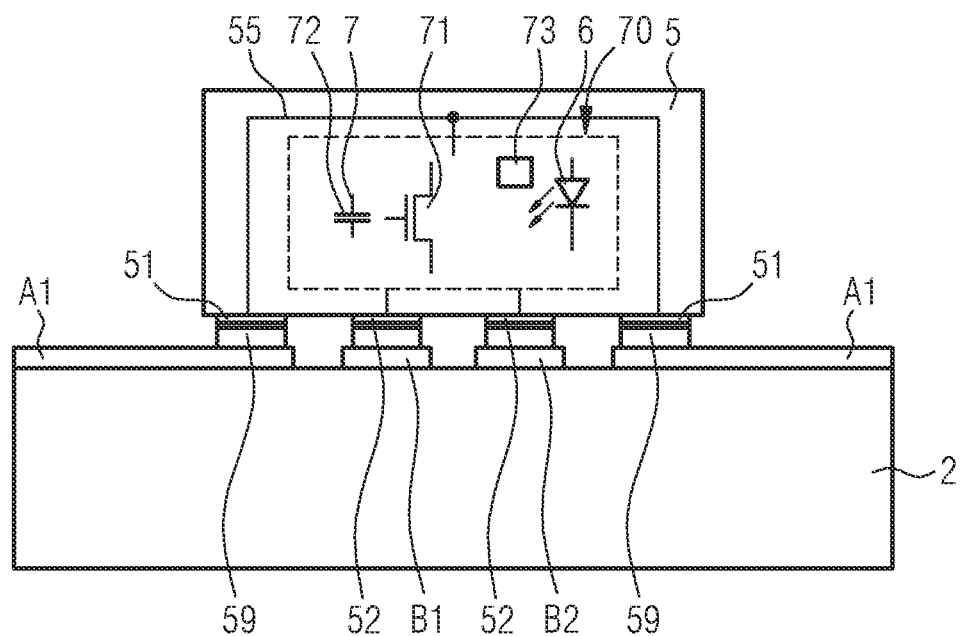

The bridging component 5 may also comprise several active regions 6, as shown in the exemplary embodiment of FIG. 2C, wherein the active regions may belong to different pixels or to the same pixel. For example, an active region 6 forms a sub-pixel 3R provided for generating radiation in the red spectral range and an active region forms a sub-pixel 3B provided for generating radiation in the blue spectral range. The active regions 6 are each electrically conductively connected with a further contact 52. A column line B1 and B2, respectively, is associated with the further contact 52. The bridging component 5 can also additionally comprise one or more electronic components 7 (FIG. 2D), for example in the form of a capacitor 72, or a transistor 71, in particular as parts of an electronic circuit 70.

The circuit 70 is designed as an integrated circuit, for example, or comprises an integrated circuit 73.

For example, the bridging component 5 contains electronic components 7 for driving one or more pixels by means of an active matrix circuit.

Figure 2E:
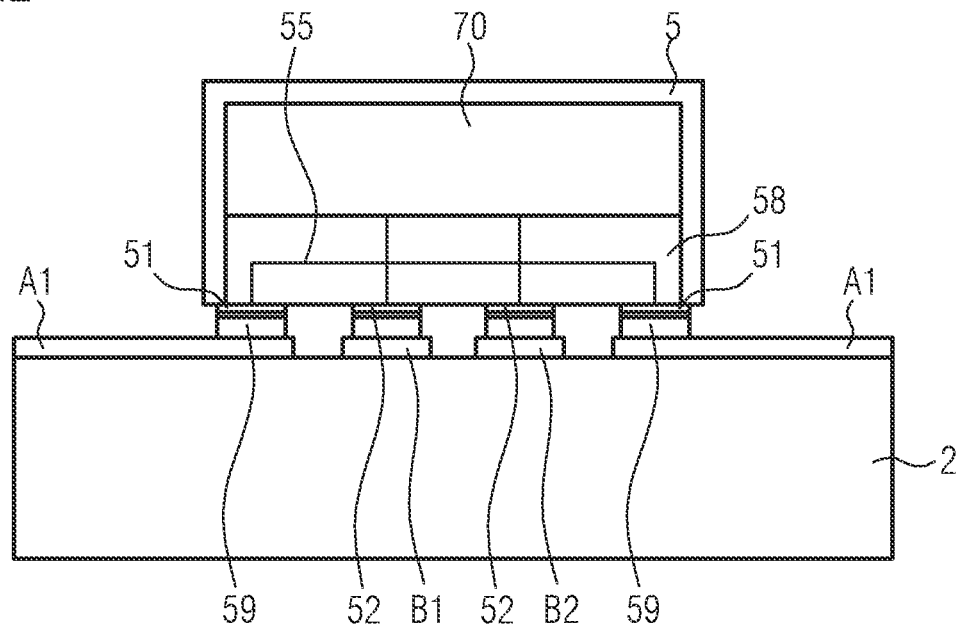

In the exemplary embodiment illustrated in FIG. 2E, the bridging component 5 comprises a submount 58 in addition to the circuit 70. The submount 58 is formed, for example, by a redistribution layer. For example, the submount 58 comprises redistribution layers with, for example, polymeric insulating layers and electrodeposited conductor paths, for example of copper.

Such submounts are frequently used in packaging technology for integrated circuits and are therefore easily and inexpensively available. The submounts 58 are also particularly suitable for forming the bridging path 55.

Figure 2F:
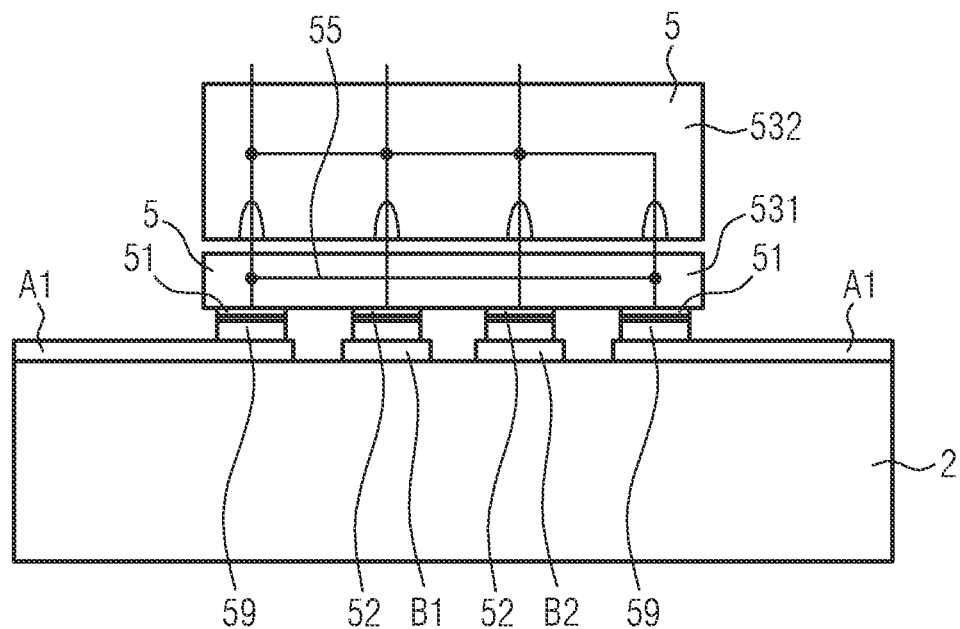

FIG. 2F illustrates an exemplary embodiment of a bridging component 5, wherein the bridging component 5 comprises a configuration with a female connector 531 and an associated male connector 532. In the exemplary embodiment shown, the bridging path 55 is formed in the female connector 531. Alternatively, the bridging path may be formed in the male connector 532. Further, either the female connector 531 or the male connector 532 may be attached to the connection carrier.

FIGS. 3A to 3F illustrate exemplary embodiments of the types of electrical contacting of the bridging component 5. These types of electrical contacting can be combined with the aforementioned exemplary embodiments for the configuration of the bridging component 5.

Figure 3A:
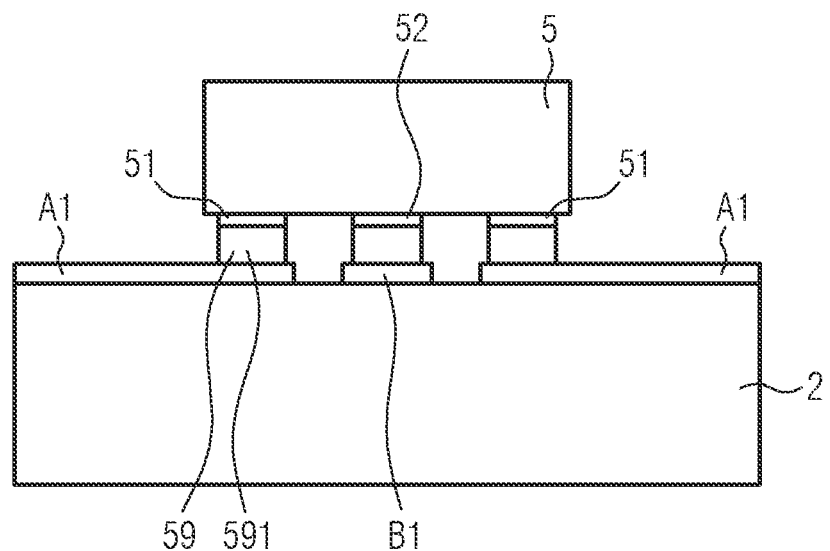

In FIG. 3A, the connecting agent 59 is formed by a connecting layer 591, for example by a solder, such as in the form of a solder paste, or by an electrically conductive adhesive. Such materials can be applied by printing or dispensing.

Figure 3B:
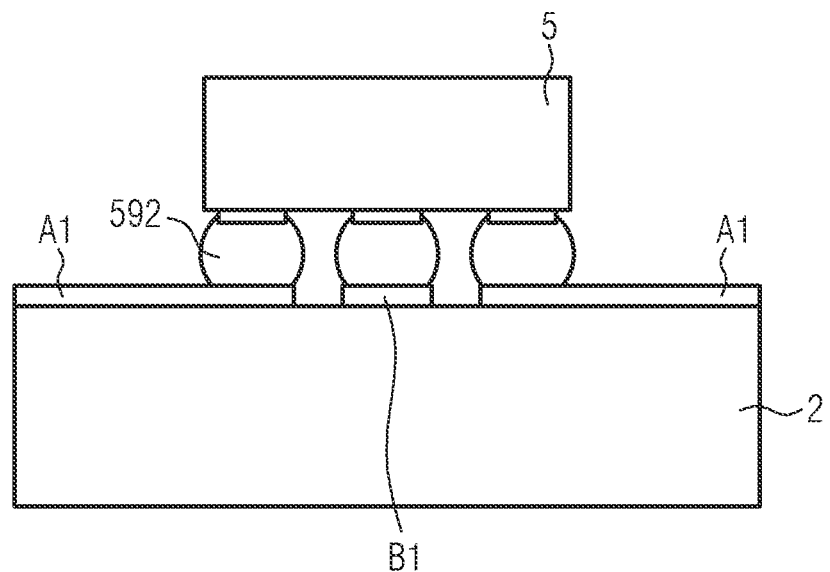

In the exemplary embodiment shown in FIG. 3B, the electrical and mechanical connection of the bridging component 5 is made via connecting balls 592, for example in the form of solder balls. These solder balls can already be arranged on the bridging components 5 when producing the display device, for example in the form of a matrix of connecting balls (also Ball Grid Array, BGA). In this way, particularly small distances between the row lines A1, A2, . . . and the column lines B1, B2, . . . can be achieved.

Figure 3C:
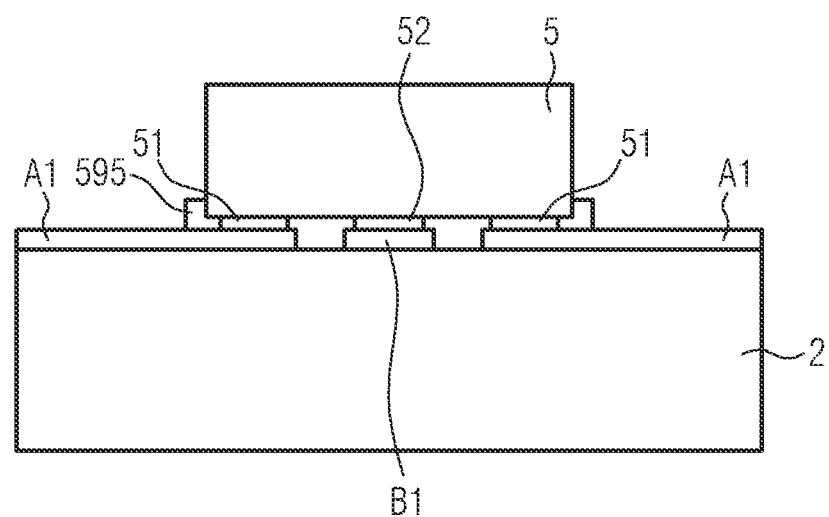

In the exemplary embodiment shown in FIG. 3C, the bridging component 5 is electrically contacted by a direct contact between the contacts 51, 52 and the row lines A1, A2, . . . or column lines B1, B2, . . . , for example by means of a direct gold-to-gold contact by means of thermocompression. Alternatively or additionally, a filler material 595 may be provided, for example an anisotropic conductive material. In this way, particularly small sizes, for example down to 10 µm, can be achieved for the contacts 51, 52.

Figure 3D:
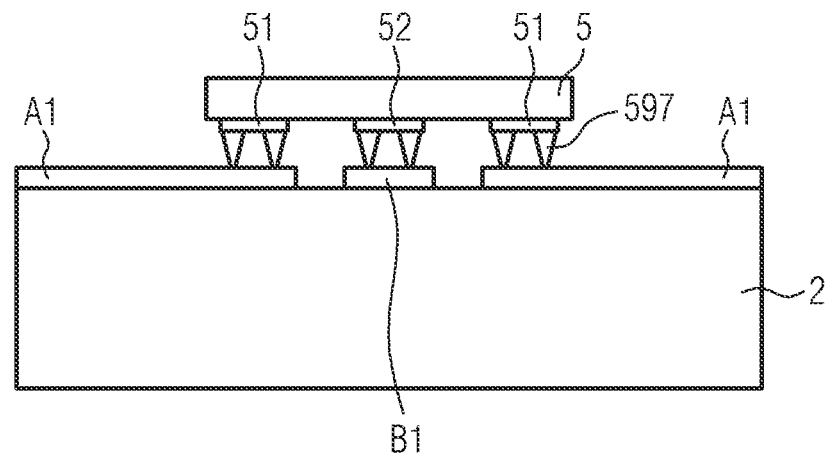

In the exemplary embodiment shown in FIG. 3D, electrical contact is made by means of tips 597. The tips 597 can be provided on the bridging component 5 or on the connection carrier 2.

The bridging components 5 can be placed, for example, by parallel chip assembly, for example by means of nubs of a stamp, for example a polydimethylsiloxane (PDMS for short) stamp, or by means of a LIFT (Laser Induced Forward Transfer) method. This is particularly suitable for particularly small bridging components 5 and/or a particularly large number of bridging components 5.

Figure 3E:
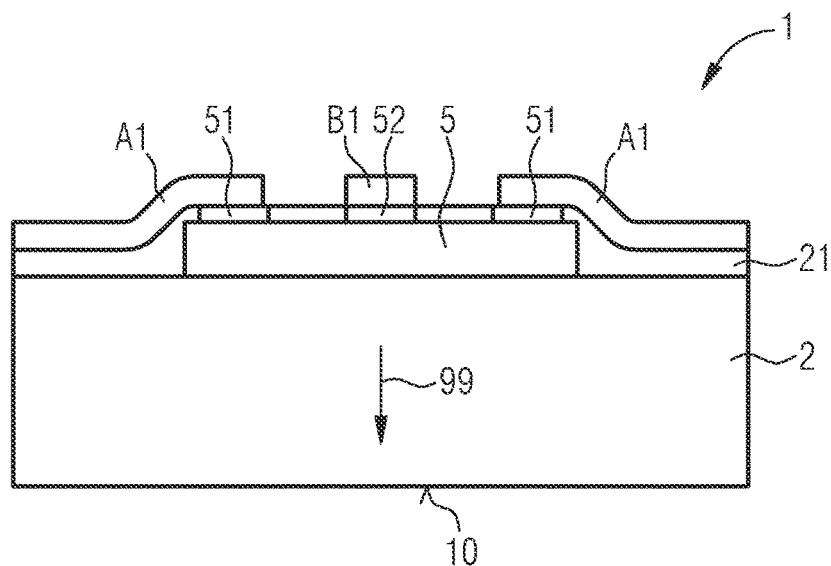

In the exemplary embodiment shown in FIG. 3E, the row lines A1, A2, . . . and the column lines B1, B2, . . . are applied in the form of a planar contact and overlap with the corresponding contacts 51, 52 of the bridging component 5. An insulating layer 21 is arranged between the connection carrier 2 and the row lines A1, A2, . . . and column lines B1, B2, . . . . This allows the row lines A1, A2, . . . and column lines B1, B2, . . . to be routed over the edge of the bridging component 5 in a simplified manner.

In this exemplary embodiment, the row lines A1, A2, . . . and column lines B1, B2, . . . are thus formed on the connection carrier 2 only after the bridging components 5 have already been arranged and, in particular, fastened to the connection carrier 2. The connection carrier 2 may be radiation-transmissive, so that a side of the connection carrier 2 facing away from the bridging component 5 forms a radiation exit surface 10 of the display device 1.

The radiated radiation is illustrated by an arrow 99 in FIG. 3E.

Figure 3F:
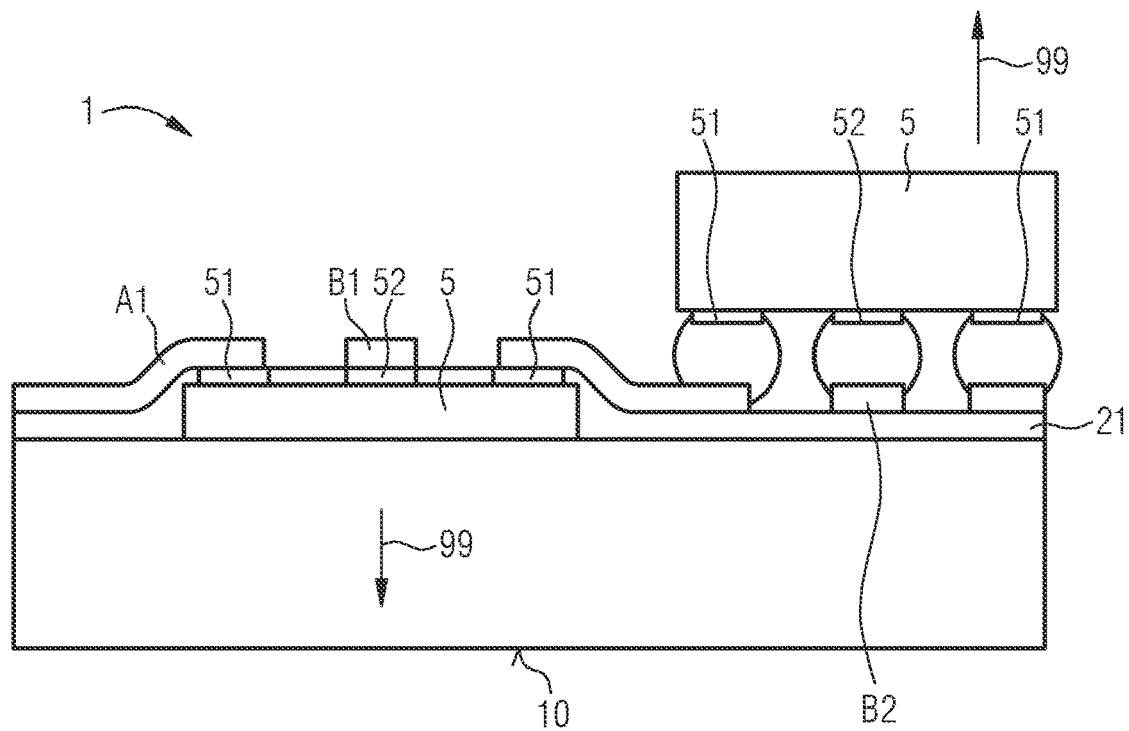

In addition, as shown in FIG. 3F, the applied electrically conductive layer can be used for the electrical contacting of further components, for example for a further bridging component 5 with one or more pixels or for a driver of the display device. For example, radiation can be emitted in two directions opposite to each other, represented by the arrows 99.

When placing a driver, the driver can be applied to the side that is not for emitting light. Thus, the drivers do not have to be placed between the bridging components 5 or at the edge, but can be placed directly above the pixels. Thus, the drivers can be much larger than a pixel or protrude over multiple pixels. Furthermore, the drivers need not be positioned at the edge of the display device, so that many display devices can be arranged seamlessly tiled together to form a large display unit, for example in the form of a video wall.

Figure 4A:
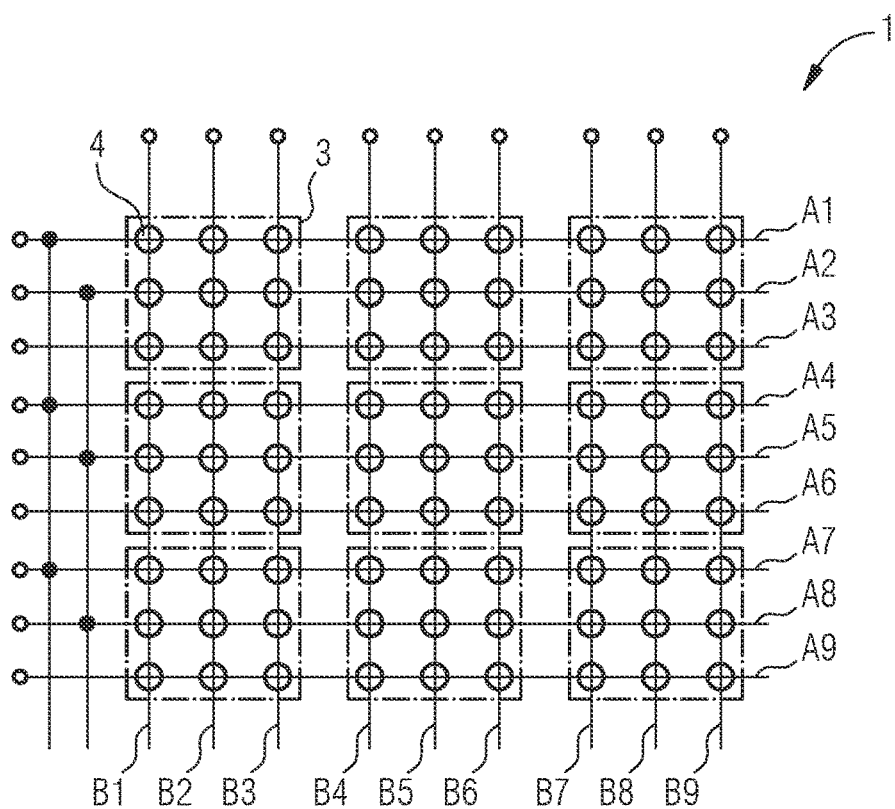
Figure 4B:
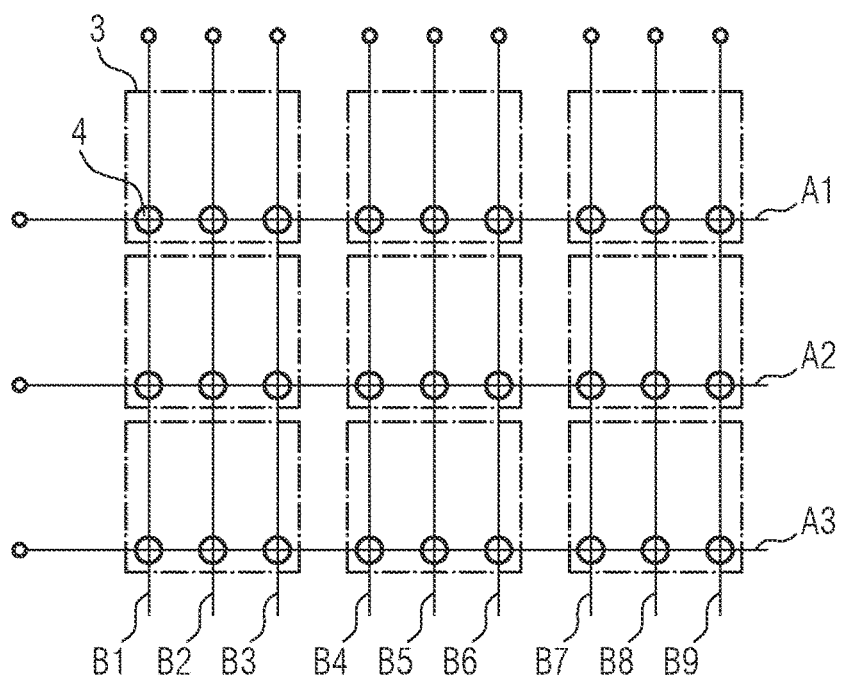

FIGS. 4A and 4B illustrate exemplary embodiments of display devices 1 in which each pixel comprises 3 sub-pixels for radiation in the green, blue and red spectral ranges. In the exemplary embodiment shown in FIG. 4A, each pixel 3 is connected with three row lines. The row lines A1, A4, A7, . . . each carry the supply voltage. The row lines A2, A5, A8, . . . each represent the ground line. The row lines A3, A6, A9, . . . each represent the selection lines with which the individual rows of pixels 3 can be activated when driving. The column lines B1, B4, B7, . . . are data lines for the green light emitting sub-pixel 3G. Correspondingly, column lines B2, B5, B8 are the data lines for the blue light emitting sub-pixel 3B and column lines B3, B6 and B9 are data lines for the red light emitting sub-pixel 3R. The color information is thus transmitted in parallel for the individual sub-pixels. This results in a total of nine imaginary crossing points 4 for each pixel 3.

In the exemplary embodiment shown in FIG. 4B, only one row line is assigned to each pixel 3. The column lines B1, B4, B7 each serially supply the data for the green light emitting, the red light emitting and the blue light emitting sub-pixel. Column lines B2, B5, B8 each provide the supply voltage and column lines B3, B6, B9 represent ground lines. The single row line serves as a selection line for the respective row of pixels. This reduces the number of imaginary crossing points 4 per pixel 3 to three. Of course, a reduction of imaginary crossing points can be achieved analogously if the number of column lines is smaller than the number of row lines.

Figure 5A:
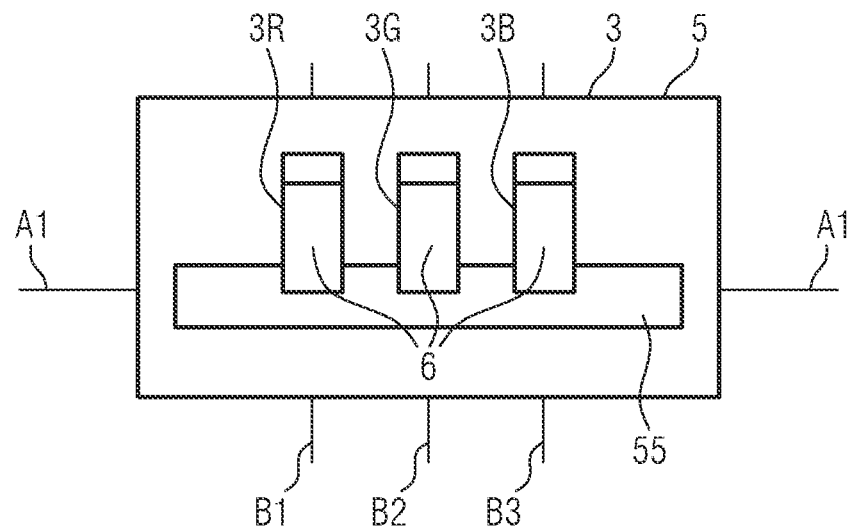
Figure 5B:
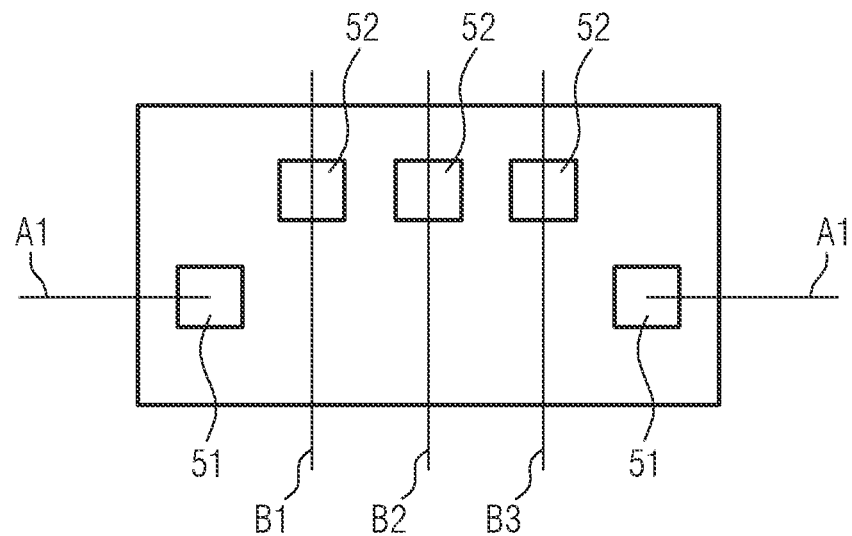

In the exemplary embodiment shown in FIGS. 5A and 5B, the bridging component 5 comprises three active regions 6, each forming a sub-pixel 3R emitting in the red spectral range, a sub-pixel 3G emitting in the green spectral range, and a sub-pixel 3B emitting in the blue spectral range. On the rear side of the bridging component 5, shown in FIG. 5B, there are contacts 51 for contacting with the row lines, for example the row line A1, and further contacts 52 for contacting with the column lines, for example the column lines B1, B2 and B3. Via vias, these contacts are electrically conductively connected with the active regions 6 on the front side of the submount. The bridging path 55 is also formed on the front side. The risk of an electrical short circuit between the bridging path 55 and the column lines B1, B2, B3 is thus avoided.

Figure 5C:
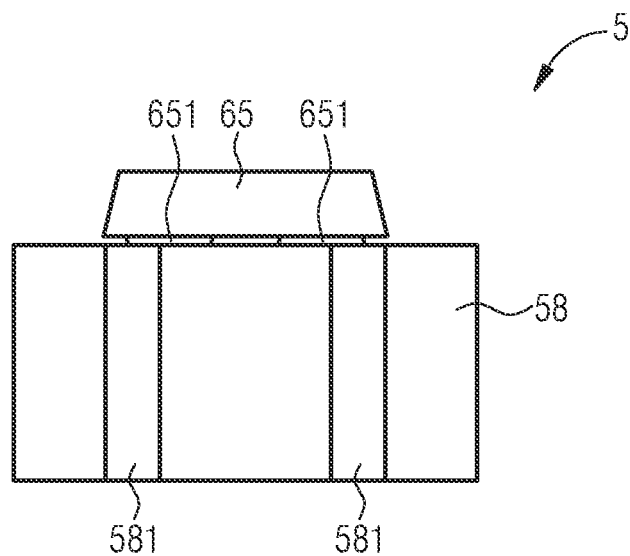
Figure 5D:
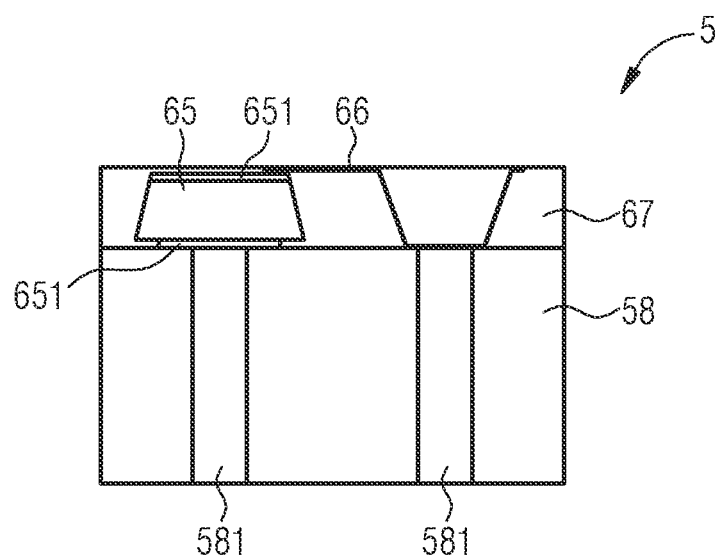

FIGS. 5C and 5D illustrate two exemplary embodiments of semiconductor chips 65, in particular LED semiconductor chips with the active regions 6. In the exemplary embodiment shown in FIG. 5C, the contact regions 651 of the semiconductor chip 65 are arranged on the same side of the semiconductor chip. The contact regions 651 are each accessible via vias 581 through the submount 58 from the rear side of the submount 58.

In the exemplary embodiment shown in FIG. 5D, the contact regions 651 of the semiconductor chip 65 are arranged on opposite sides of the semiconductor chip. The semiconductor chip 65 is surrounded by an electrically insulating separation layer 67. The contact region 651 arranged on the side of the semiconductor chip 65 facing away from the submount 58 is connected to a via 581 via a connection line 66. The connection line 66 is formed, for example, by a planar contact.

Figure 6A:
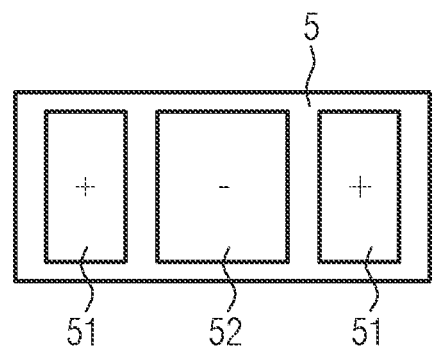
FIG. 6A shows an exemplary embodiment of a bridging component in rear side view with associated contacting in a display device in FIG. 6B.
Figure 6B:
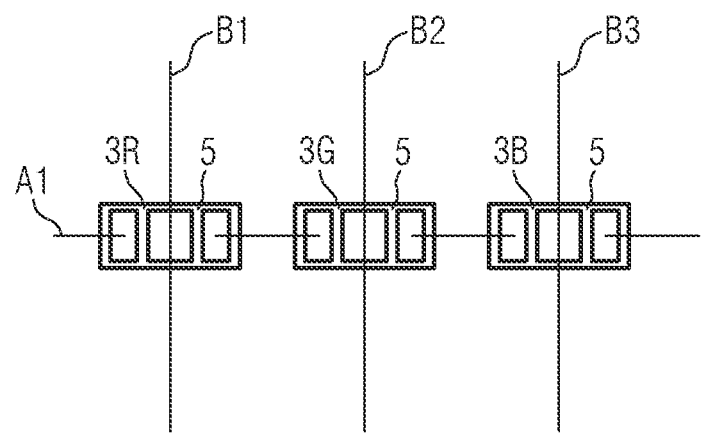

FIGS. 6A and 6B illustrate an exemplary embodiment in which each bridging component 5 forms a sub-pixel 3R, 3G, 3B. Each bridging component 5 comprises contacts 51, for example anodes, and another contact 52, for example a cathode. As described in connection with FIG. 2B, the bridging path runs between the contacts 51, while the active region 6 of the pixels 3 is located in a current path between the contacts 51 and the further contact 52, respectively.

Except for the wavelength of the radiation emitted from the active regions 6, the sub-pixels 3R, 3G, 3B may be formed in the same way. With such bridging components 5, a full-color display device 1 with a passive-matrix arrangement can be easily and inexpensively realized.

Figure 7A:
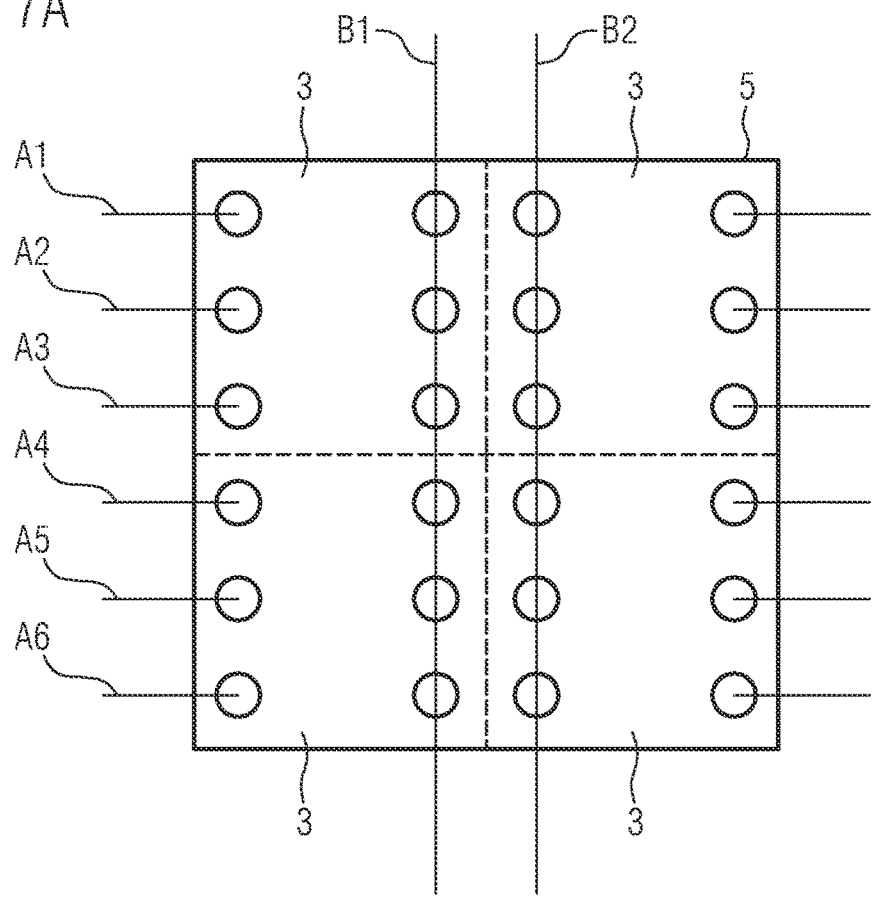
FIGS. 7A and 7B show an exemplary embodiment of a bridging component on a rear side (FIG. 7A) and in top view (FIG. 7B)
Figure 7B:
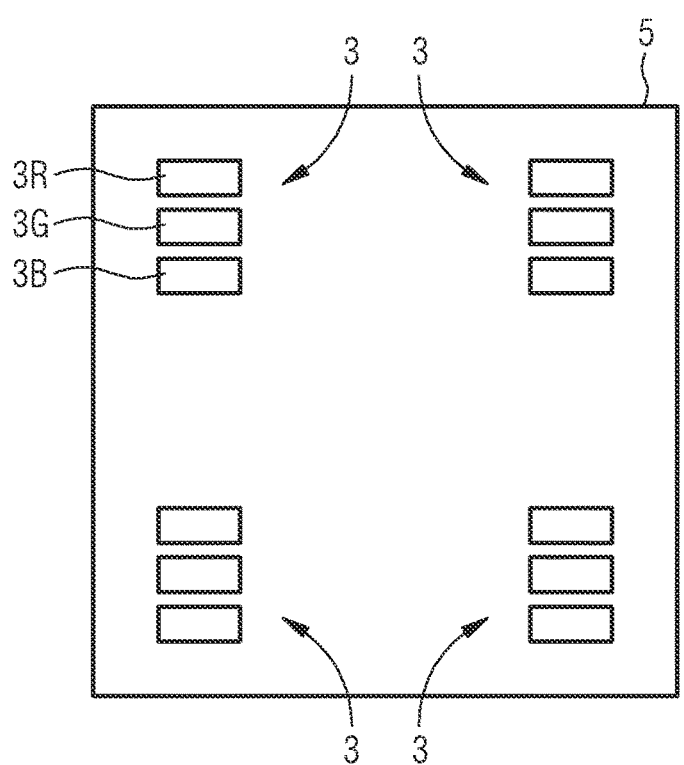

FIGS. 7A and 7B illustrate an exemplary embodiment in which a bridging component 5 provides a plurality of pixels 3, for example 2×2 pixels each with three sub-pixels 3R, 3G, 3B, thus with a total of twelve active regions. Electrical contact is made via six row lines A1 to A6 and two column lines B1, B2, wherein the column lines B1 and B2 are bridged by all row lines A1 to A6 without short circuits by means of the bridging component 5 and thus all row lines A1 to A6 are electrically conductively bridged.

For such a bridging component 5, semiconductor chips in flip-chip geometry (compare FIG. 5C) can be placed on a glass submount, for example. At the rear side, the bridging component 5, which is configured in surface mounted technology (SMT), can comprise, for example, connection balls for electrical contacting to the row lines and column lines.

Figure 8A:
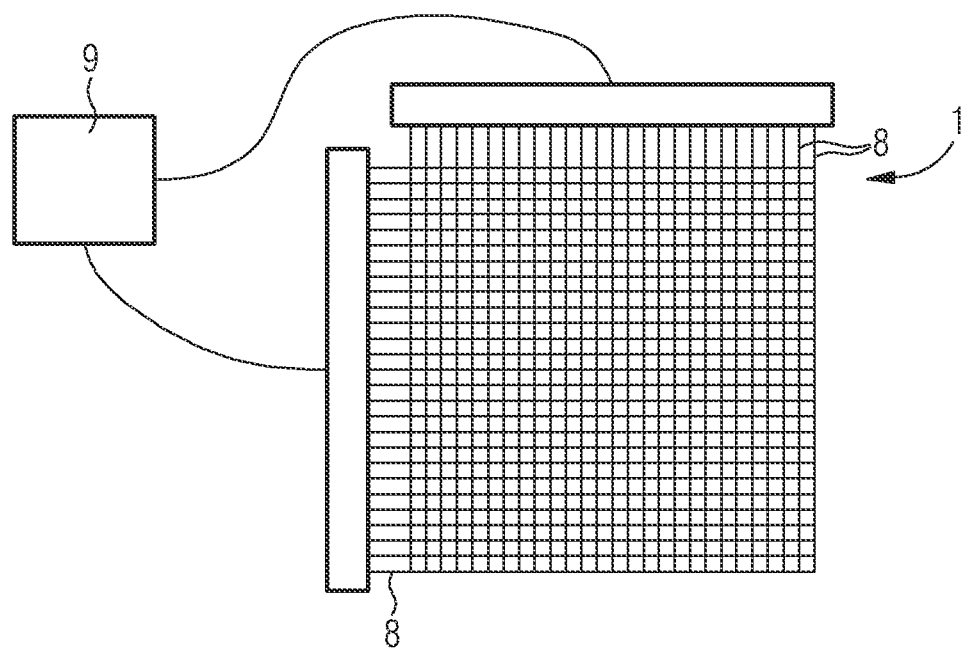
FIG. 8A shows an exemplary embodiment of a display device with electrical contacting.

FIG. 8A illustrates an exemplary embodiment of a display device 1 in which the terminals 8 for the row lines A1, A2, . . . and the terminals 8 for the column lines B1, B2, . . . are formed on two side surfaces 15 of the display device 1 extending perpendicular to each other. The terminals 8 are electrically conductively connected, for example, via a flexible printed circuit board with a driver 9.

Figure 8B:
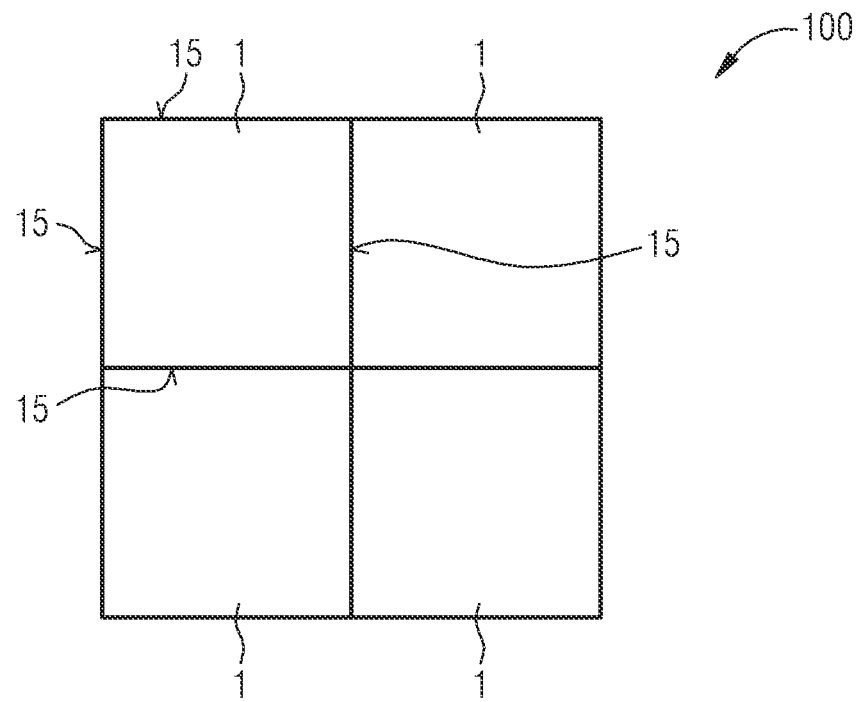
FIG. 8B shows an exemplary embodiment of a display unit with a plurality of display devices as shown in FIG. 8A.

By using four such display devices, each of which is rotated 90° with respect to the other, a display unit 100 can be realized as shown in FIG. 8B. For example, with a 16×32 driver per display device 1, a display unit 100 with a maximum of 2048 RGB pixels or 6144 monochrome pixels can be realized. Further enlargement of the display unit 100 by using multiple display devices 1 is not readily possible in this exemplary embodiment.

Figure 8C:
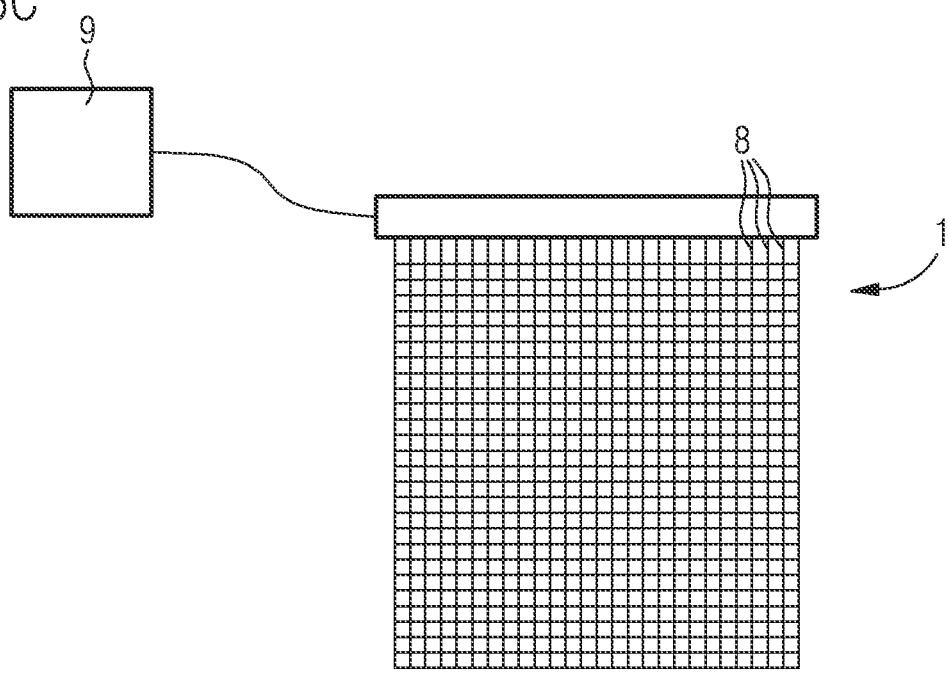
FIG. 8C shows an exemplary embodiment of a display device with electrical contacting.
Figure 8D:
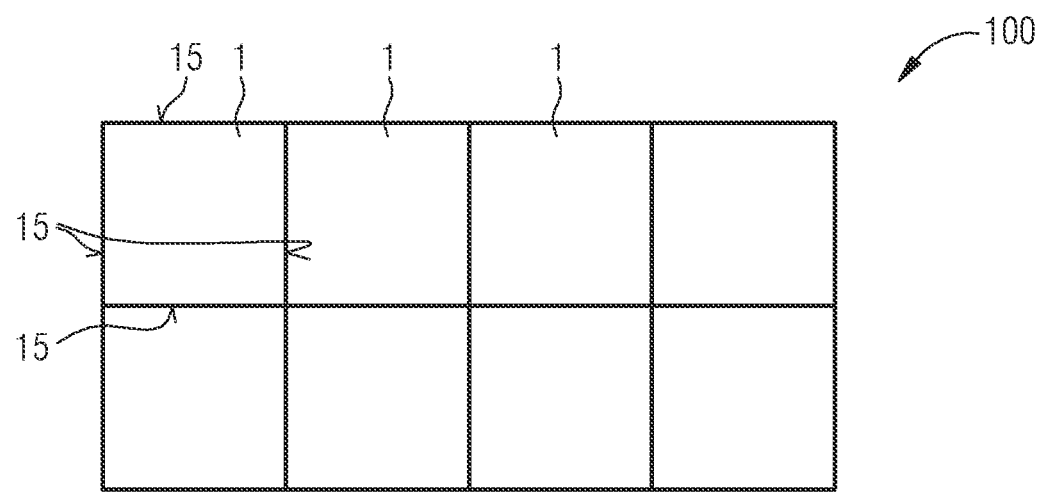
FIG. 8D shows an exemplary embodiment of a display unit with a plurality of display devices according to FIG. 8C.

In contrast, in the exemplary embodiment shown in FIG. 8C, the terminals 8 of the row lines A1, A2, . . . and the column lines B1, B2, . . . are accessible on one side surface of the display device 1. Thus, several such display devices 1 as shown in FIG. 8D can be realized to form a display unit 100 with two rows and any number of columns of display devices.

Figure 9A:
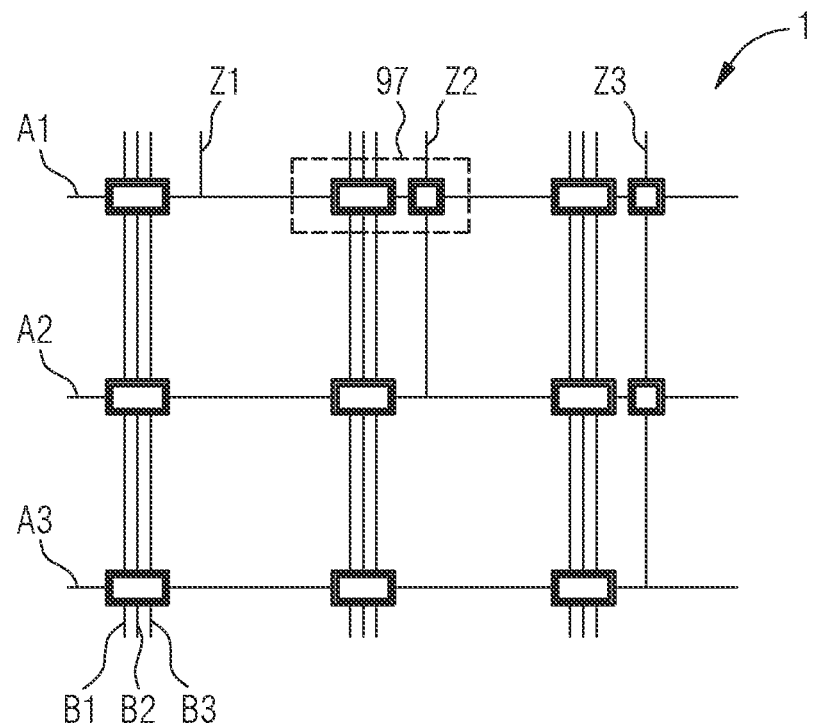

The way of electrically contacting the row lines will be described in more detail with reference to FIGS. 9A to 9E. As shown in FIG. 9A, the row lines A1, A2, . . . are each connected to the associated terminals 8 via supply lines Z1, Z2, Z3. The feed lines Z1, Z2, Z3 run essentially parallel to the column lines B1, B2, . . . .

Figure 9B:
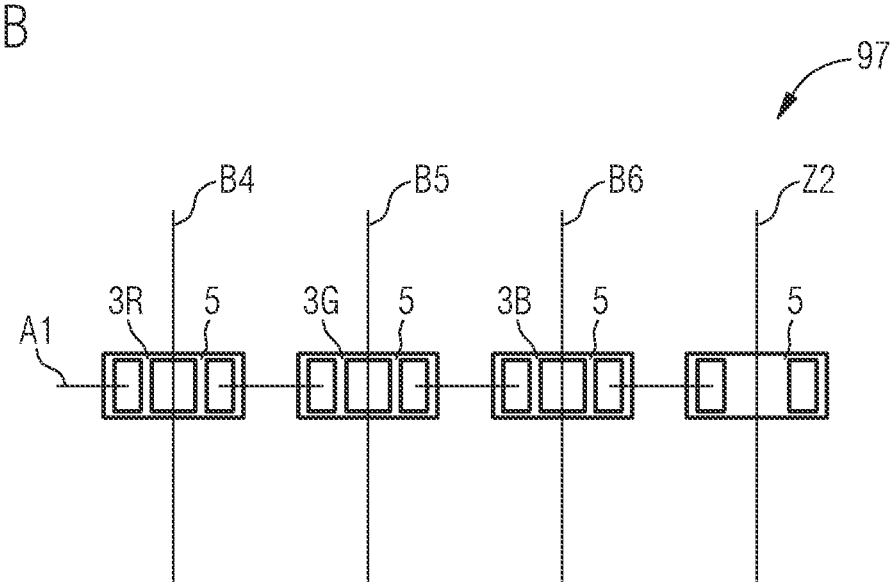

In FIG. 9B, a detail 97 of FIG. 9A is shown enlarged. In this detail 97, the bridging components 5 for the sub-pixels 3R, 3G, 3B are formed as described in connection with FIG. 6. In addition, a bridging component 5 is provided which overcomes a feed line, exemplarily the feed line Z2.

The feed lines Z1, Z2, . . . can thus be formed without overlapping with the row lines A1, A2, . . . and the column lines B1, B2, . . . . A further electrically conductive layer is therefore not required for the feed lines Z1, Z2, . . . .

Figure 9C:
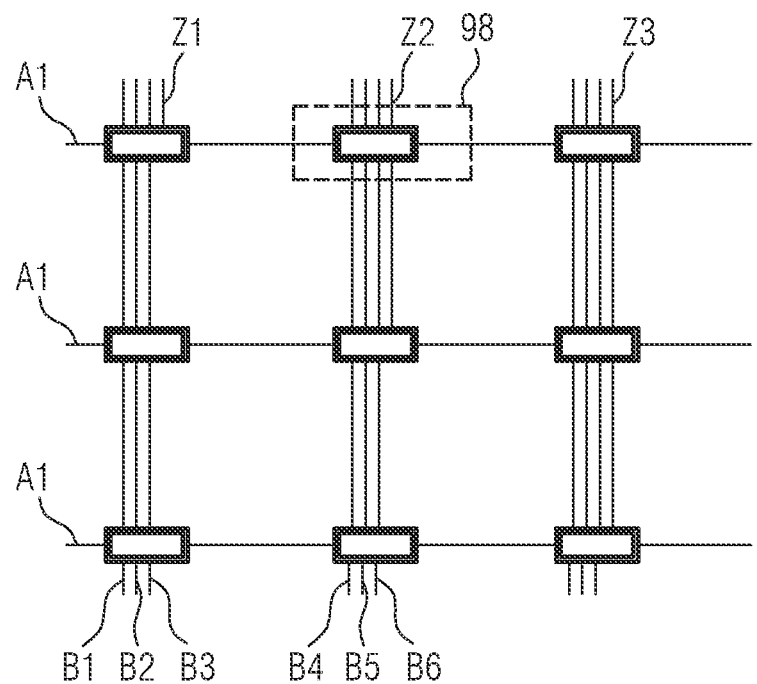
Figure 9D:
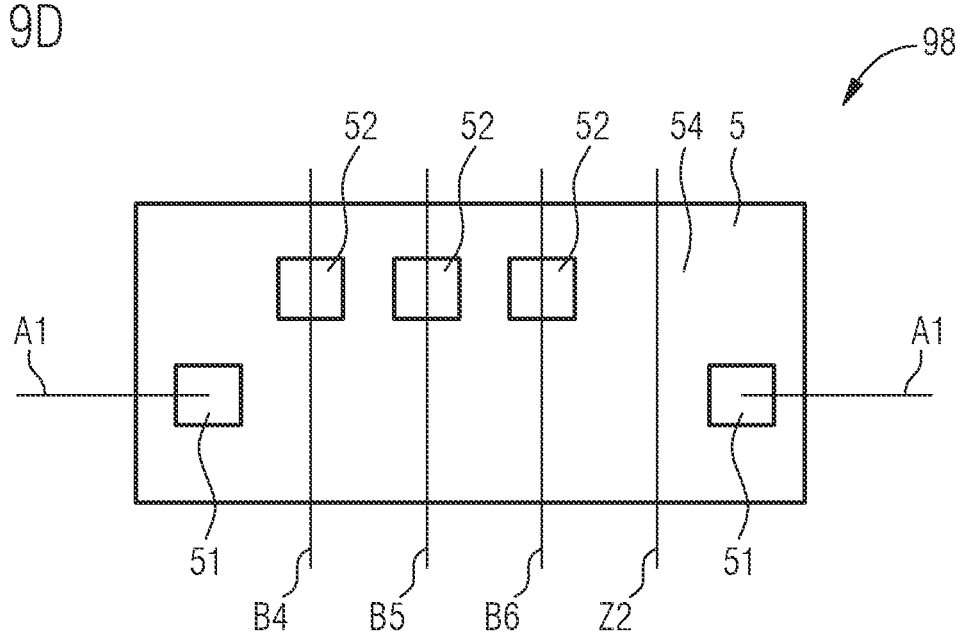

In the exemplary embodiment shown in FIGS. 9C and 9D, in which FIG. 9D represents an enlargement of the detail 98 of FIG. 9C, the bridging components 5 are formed essentially as described in connection with FIG. 5B.

In contrast, there is a free space 54 between two contacts of the bridging component 5, in FIG. 9 exemplarily between one of the contacts 51 and one of the further contacts 52. The feed line is led under the bridging component 5 in the region of the free space.

Figure 9E:
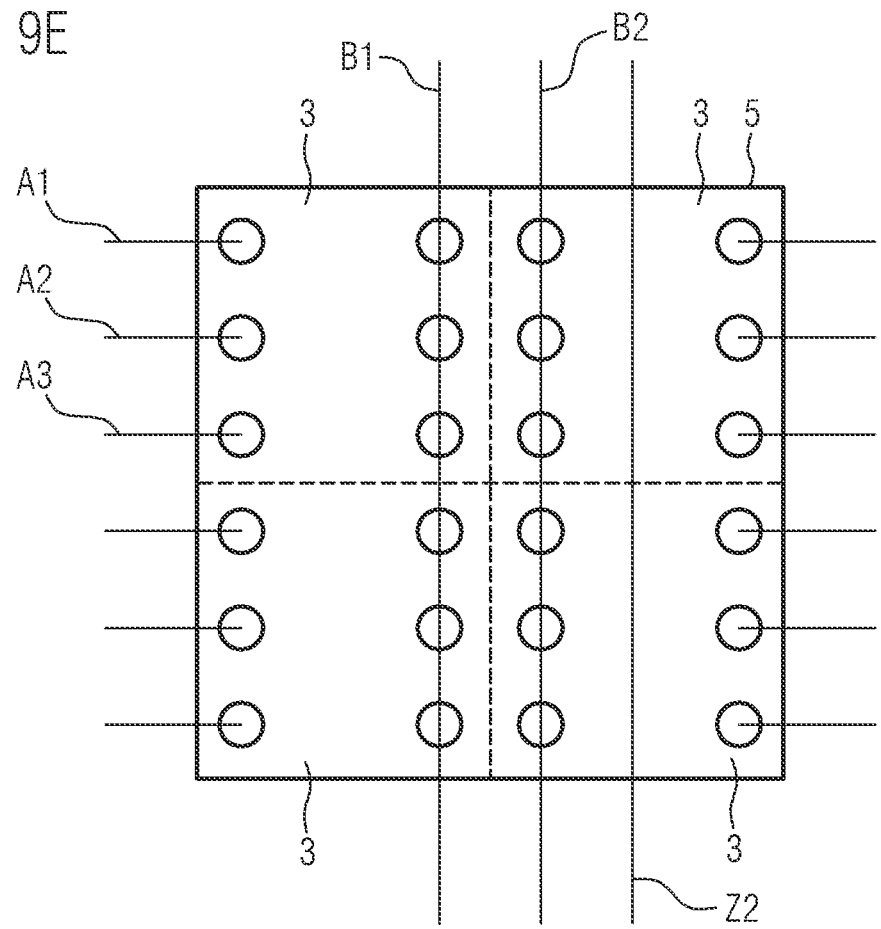
FIG. 9E shows an exemplary embodiment of a bridging component with associated electrical contact on a rear side.

As shown in FIG. 9E, this can also be used analogously for a bridging component 5 which is designed, for example, as described in connection with FIG. 7A.

FIGS. 10A to 10D illustrate exemplary embodiments of a display device in which the drivers 9 are each arranged on a side of the connection carrier 2 facing away from the radiation exit surface 10. The driver 9 is connected to the connection carrier 2, for example, via terminal connectors 85, such as in the form of connection balls (BGA balls).

Figure 10A:
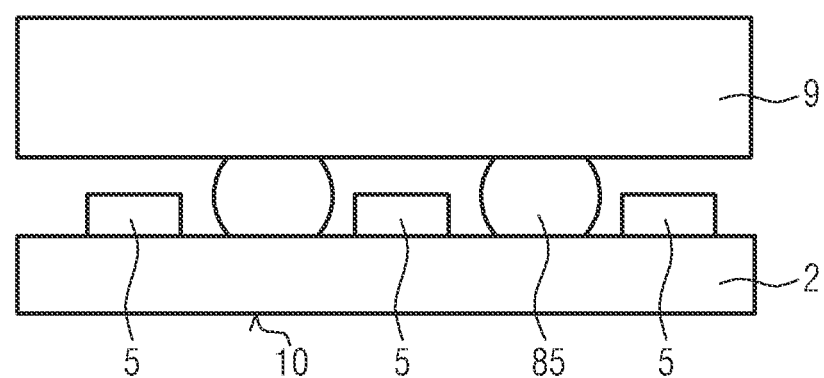
FIGS. 10A, 10B, 10C and 10D each show an exemplary embodiment of a display device with driver in schematic sectional view (FIG. 10A), by means of schematic top views (FIGS. 10B and 10C) and an enlarged section in top view in FIG. 10D.
Figure 10B:
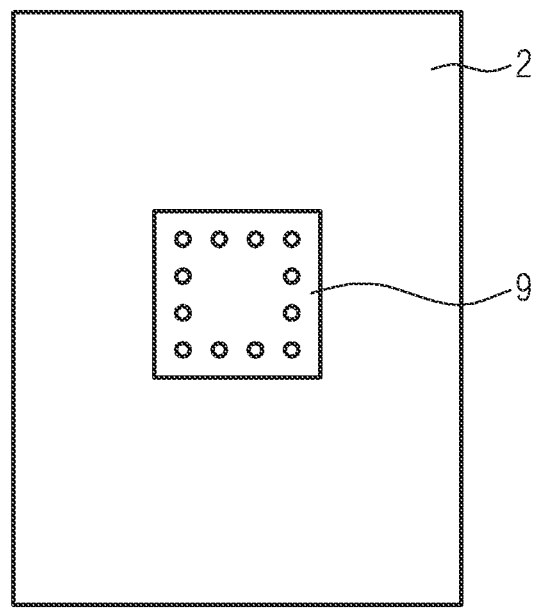

Typically, however, the dimension of such drivers, as shown in FIG. 10B, is smaller than the dimension of the connection carrier 2 and thus of the display device 1. This means that not all row lines A1, A2, . . . and column lines B1, B2, . . . can be connected directly with the driver.

Figure 10C:
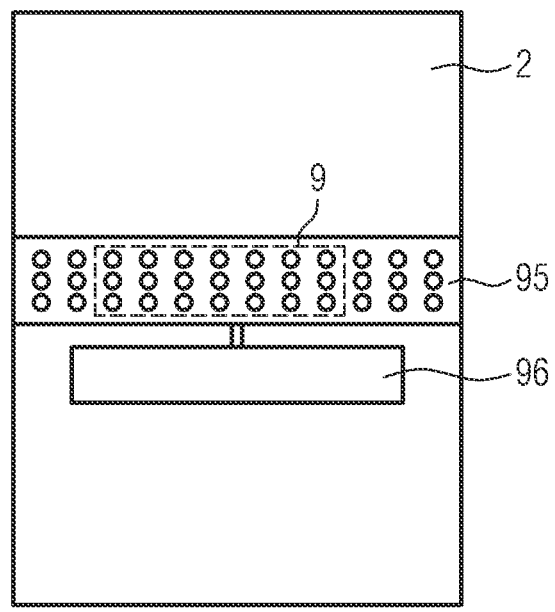
Figure 10D:
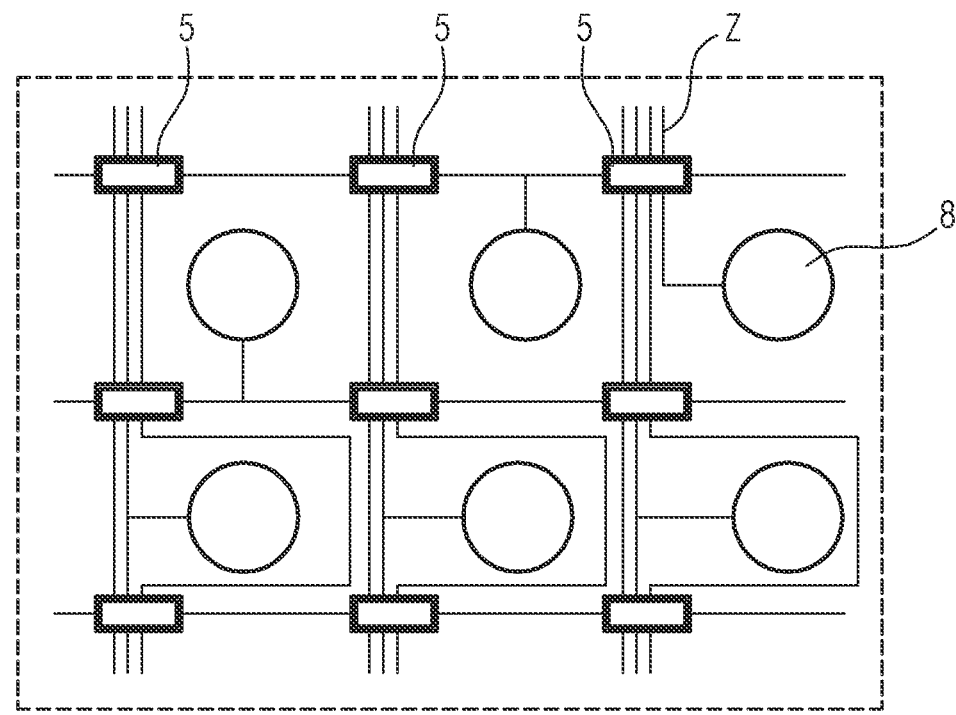

FIG. 10C illustrates an exemplary embodiment in which a driver 9 is electrically conductively connected to the connection carrier 2 via a connector 95. The connector 95 is integrated in a housing of the driver 9, for example. The connector thus produces a rewiring layer between the connection carrier 2 and the actual driver 9. Here, the connector 95 extends over almost the entire width of the connection carrier, so that all column lines can be electrically contacted via terminals 8. Row lines which do not overlap with connector 95 can be electrically contacted via feed lines Z, as shown in FIG. 10D. The external electrical supply to the driver 9 is provided, for example, via a plug connector 96, such as a male connector or a female connector. In a top view of the connection carrier 2, the plug connector 96 completely overlaps with the connection carrier 2.

Such display devices 1 do not require any space on the side surfaces for electrical contact with the driver 9, so that they can be arranged edge-to-edge along two mutually perpendicular directions. As a result, the number of pixels of a display unit 100 can be increased practically at will by increasing the number of display devices 1.

The invention is not limited by the description based on the exemplary embodiments. Rather, the invention encompasses any new feature as well as any combination of features, which in particular includes any combination of features in the claims, even if that feature or combination itself is not explicitly specified in the claims or the exemplary embodiments.

LIST OF REFERENCE SIGNS 1 display device
10 radiation exit surface 100 display unit
15 side surface
2 connection carrier
21 insulating layer
3 image point
3R, 3G, 3B sub-pixel
4 imaginary crossing point
5 bridging component
51 contact
52 further contact
54 free space
55 bridging path
58 submount
581 via
59 connecting agent
591 connecting layer
592 connecting ball
595 filler material
597 tip
6 active region
65 semiconductor chip
651 contact region
66 connection line
67 separation layer
7 electronic component
70 circuit
71 transistor
72 capacitor
73 integrated circuit
8 terminal
85 terminal connector
9 driver
95 connector
96 plug connector
97 detail
98 detail
99 arrow
A1, A2, . . . row line
A1_1 sub-region
A1_2 sub-region
B1, B2, . . . column line
Z, Z1, Z2, . . . feed line

The invention claimed is:

1. A display device with a connection carrier and a plurality of pixels which are drivable via row lines and column lines, wherein—the row lines and the column lines are formed on the connection carrier, —at least one row line is interrupted in an extension direction at a crossing point of the extension direction with a column line on the connection carrier, and—a bridging component is arranged on the connection carrier, which bridges the row line at the crossing point in an electrically conductive manner, —the row lines and the column lines comprise terminals for electrical contacting with a driver for driving the pixels, —row lines are each connected via a feed line with one of the terminals, and—row lines which are located between a row line and the associated terminal are bridged by means of a second bridging component.

2. The display device according to claim 1,
wherein the row lines and the column lines are formed without overlapping each other as seen in top view of the connection carrier.

3. The display device according to claim 1,
wherein the bridging component comprises two contacts which are at the same potential during operation of the display device and are electrically conductively connected with the same row line.

4. The display device according to claim 1,
wherein the bridging component comprises at least one active region provided for generating radiation and a bridging path is formed in the bridging component between the two contacts, wherein the bridging path does not extend through the active region.

5. The display device according to claim 1,
wherein the bridging component comprises a plurality of active regions each forming one of the pixels or a subpixel of the pixels.

6. The display device according to claim 1,
wherein the bridging component comprises at least one electronic component.

7. The display device according to claim 1,
wherein the bridging component comprises a submount on which at least one pixel is formed.

8. The display device according to claim 7,
wherein the submount comprises a plurality of vias and the at least one pixel is formed on a side of the submount facing away from the connection carrier.

9. The display device according to claim 1, wherein, in a sectional view of the display device, at least one of the bridging component and/or at least one pixel are arranged between the connection carrier and one of the row lines.

10. The display device according to claim 1, wherein, in a sectional view of the display device, at least one of the bridging component or at least one pixel are arranged on a side of one of the row lines facing away from the connection carrier.

11. The display device according to claim 1,
wherein the connection carrier is transparent to the radiation emitted by the pixels during operation.

12. The display device according to claim 1,
wherein more column lines than row lines are associated with a pixel or vice versa.

13. A display unit with a plurality of display devices according to claim 1.

14. A display device with a connection carrier and a plurality of pixels which are drivable via row lines and column lines, wherein the row lines and the column lines are formed on the connection carrier, at least one row line is interrupted in an extension direction at a crossing point of the extension direction with a column line on the connection carrier, a bridging component is arranged on the connection carrier, which bridges the row line at the crossing point in an electrically conductive manner, the row lines and the column lines comprise terminals for electrical contacting with a driver for driving the pixels, row lines are each connected via a feed line with one of the terminals, row lines which are located between a row line and the associated terminal are bridged by means of a second bridging component, and the terminals for the electrical contacting of the row lines and the column lines are arranged along exactly one side surface of the display device.

15. The display device according to claim 14,
wherein the feed lines extend without overlap with respect to the row lines.

16. A display device with a connection carrier and a plurality of pixels which are drivable via row lines and column lines, wherein the row lines and the column lines are formed on the connection carrier, at least one row line is interrupted in an extension direction at a crossing point of the extension direction with a column line on the connection carrier, and a bridging component is arranged on the connection carrier, which bridges the row line at the crossing point in an electrically conductive manner, the row lines and the column lines comprise terminals for electrical contacting with a driver for driving the pixels, row lines are each connected via a feed line with one of the terminals, row lines which are located between a row line and the associated terminal are bridged by means of a second bridging component, and the driver for driving the row lines and the column lines is arranged on a side facing away from a radiation exit surface of the display device and all side surfaces of the display device are free of terminals for the row lines and the column lines.

17. The display device according to claim 16,
wherein the row lines are each connected to the driver via a feed line and the feed lines extend without overlap to the row lines.

18. The display device according to claim 17,
wherein the feed lines are connected to the driver via a connector, wherein the connector comprises a larger extension in a direction parallel to the row lines than the driver, and wherein the connector extends at least over all inner column lines in a top view of the display device.

* * * * *